United States Patent
Zhu et al.

(10) Patent No.: US 8,519,781 B1
(45) Date of Patent: Aug. 27, 2013

(54) ADAPTIVE VOLTAGE SCALING USING A DELAY LINE

(71) Applicant: Marvell International Ltd., Hamilton, MA (US)

(72) Inventors: Jun Zhu, San Jose, CA (US); Joseph Jun Cao, Los Gatos, CA (US); Ian Swarbrick, Santa Clara, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/744,462

(22) Filed: Jan. 18, 2013

Related U.S. Application Data

(63) Continuation of application No. 12/899,813, filed on Oct. 7, 2010, now Pat. No. 8,378,738.

(60) Provisional application No. 61/252,512, filed on Oct. 16, 2009.

(51) Int. Cl.
*G05F 1/10* (2006.01)

(52) U.S. Cl.
USPC .......................................... 327/538; 327/158

(58) Field of Classification Search
USPC ................... 327/530, 538, 540, 541, 158, 161
See application file for complete search history.

(56) References Cited

U.S. PATENT DOCUMENTS

| | | | |
|---|---|---|---|
| 6,667,651 B2 | 12/2003 | Hashiguchi | |
| 6,924,679 B2 | 8/2005 | Seno et al. | |
| 7,501,868 B2 | 3/2009 | Ito | |
| 7,733,138 B2* | 6/2010 | Uehara et al. | 327/158 |
| 8,004,348 B2 | 8/2011 | Ikenaga et al. | |
| 2005/0062507 A1* | 3/2005 | Naffziger et al. | 327/105 |

FOREIGN PATENT DOCUMENTS

WO  2008099878 A1  8/2008

* cited by examiner

*Primary Examiner* — Quan Tra

(57) ABSTRACT

In one embodiment, a method includes determining, for an integrated circuit chip, a delay measurement corresponding to a first number of stages in a delay line. A power supply voltage measurement is also determined. The method determines a second number of stages correlated to the power supply voltage measurement. The second number of stages correspond to a desired timing delay. It is determined if a power supply voltage should be adjusted using a comparison based on the first number of stages and the second number of stages. A control signal is output for adjusting the power supply voltage when it is determined the power supply voltage should be adjusted.

20 Claims, 5 Drawing Sheets

ADAPTIVE VOLTAGE SCALING USING A DELAY LINE

CROSS-REFERENCE TO RELATED APPLICATIONS

This application is a continuation of U.S. patent application Ser. No. 12/899,813, filed on Oct. 7, 2010, now U.S. Pat. No. 8,378,738, which claims priority to U.S. Provisional App. No. 61/252,512 for "Using DLL To Do Adaptive Voltage Scaling" filed Oct. 16, 2009, the contents of which are incorporated herein by reference in their entirety.

BACKGROUND

Particular embodiments generally relate to adaptive voltage scaling.

Unless otherwise indicated herein, the approaches described in this section are not prior art to the claims in this application and are not admitted to be prior art by inclusion in this section.

Adaptive voltage scaling may be used on system-on-a-chip (SOC) designs to save dynamic power and leakage power. Process, power supply voltage level, and temperature (PVT) corners cause variation in timing for paths of an integrated circuit (IC) chip. For example, the delay for a NAND gate in a worst case scenario (e.g., slowest PVT corner) may be several times more than that in a best case scenario (e.g., fastest PVT corner). Conventionally, the SOC designs use the slowest PVT corner to target all timing corners, which is not efficient in power saving.

Adaptive voltage scaling may be used to improve the power consumption on the IC. Adaptive voltage scaling is used to apply a minimum power supply voltage that is required to meet critical path timing in a PVT corner for the chip. For example, a system runs at 500 MHz with a timing budget for a critical path of two nanoseconds (ns). Depending on the real delay timing measured for the critical path, the power supply voltage is adjusted to meet the timing requirements. For example, if the real critical path timing delay is 1.2 ns, it is determined that the real critical path timing delay is unnecessarily fast. In this case, the power supply voltage may be lowered to increase the real critical path timing delay. Lowering the power supply voltage increases the delay to bring the real critical path timing closer to the desired timing budget. Also, by lowering the voltage, power is saved. In another example, if the real critical path delay is 2.1 ns, then the power supply voltage can be increased to decrease the real critical path delay to bring the delay closer to the desired timing budget. Adaptive voltage scaling continuously measures the real critical path delay and attempts to make the critical path delay to be 2.0 ns to maximize power saving.

Measuring the delay requires a special circuit on the chip for performing the adaptive voltage scaling, which uses area on the chip and increases cost. For example, the adaptive voltage scaling circuit may determine when to increase or decrease the voltage based on a frequency of a reference signal and temperature measured from the chip. Accordingly, special circuits that can measure the frequency and the temperature are needed. Additionally, logic to interpret the measured frequency and temperature, and determine whether to increase or decrease the power supply voltage is also needed. This increases the cost and also requires a hardware change to incorporate the frequency and temperature measuring circuits.

SUMMARY

In one embodiment, a method includes determining, for an integrated circuit chip, a delay measurement corresponding to a first number of stages in a delay line. A power supply voltage measurement is also determined. The method determines a second number of stages correlated to the power supply voltage measurement. The second number of stages correspond to a desired timing delay. It is determined if a power supply voltage should be adjusted using a comparison based on the first number of stages and the second number of stages. A control signal is output for adjusting the power supply voltage when it is determined the power supply voltage should be adjusted.

In one embodiment the delay measurement varies based on different values for process, power supply voltage, and temperature for the chip.

In one embodiment the method includes increasing the power supply voltage to decrease the delay measurement and decreasing the power supply voltage to increase the delay measurement.

In one embodiment, the first number of stages is scaled to a new number of stages based on differences in operating frequency for the delay line and a processing unit. The new number of stages is compared with the second number of stages.

In another embodiment, an apparatus includes a measurement block configured to determine a delay measurement corresponding to a first number of stages in a delay line. A voltage measurement block is configured to determine a power supply voltage measurement. A control block is configured to: determine a second number of stages correlated to the power supply voltage measurement, the second number of stages corresponding to a desired timing delay; determine if a power supply voltage should be adjusted using a comparison based on the first number of stages and the second number of stages; and output a control signal for adjusting the power supply voltage when it is determined the power supply voltage should be adjusted.

In one embodiment, the apparatus includes a voltage regulator configured to adjust the power supply voltage by a voltage scaling step based on the control signal.

In one embodiment, the apparatus includes a delay locked loop that includes the delay line.

In another embodiment, a system includes the apparatus and a processing unit coupled to the power supply voltage and the delay line.

The following detailed description and accompanying drawings provide a more detailed understanding of the nature and advantages of the present invention.

DETAILED DESCRIPTION

Described herein are techniques for adaptive voltage scaling on an integrated circuit (IC) chip. In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Figure 1:
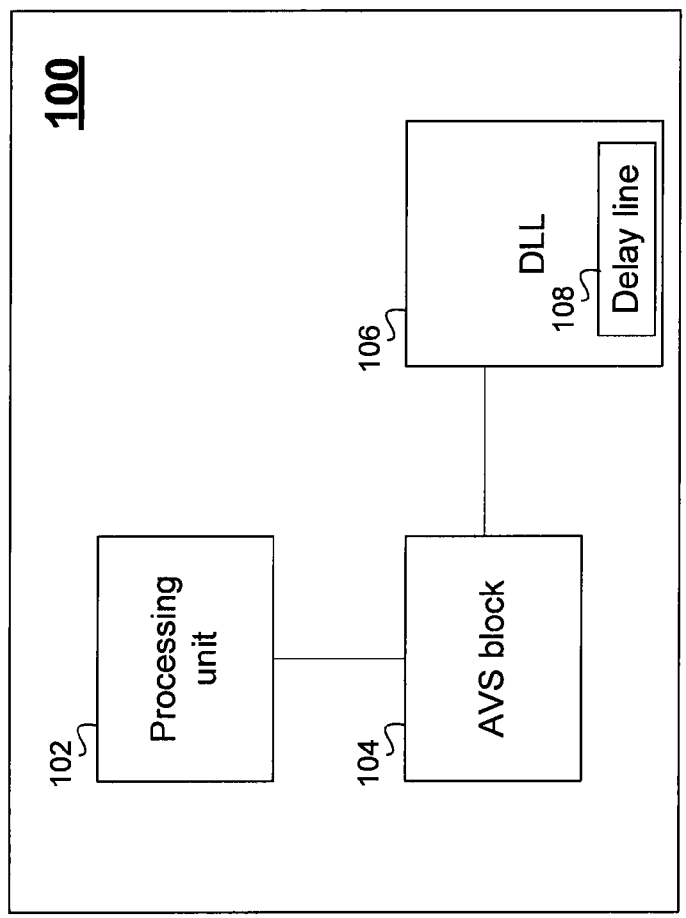
FIG. 1 depicts a system for providing adaptive voltage scaling (AVS) according to one embodiment.

FIG. 1 depicts a system 100 for providing adaptive voltage scaling (AVS) according to one embodiment. In one embodiment, system 100 may be part of a system-on-a-chip (SOC). System 100 includes a processing unit 102, an adaptive voltage scaling block 104, and a delayed locked loop (DLL) 106. Particular embodiments use a delay line 108 in DLL 106 to perform adaptive voltage scaling.

Different process, power supply voltage, and temperature (PVT) corners cause variations in timing for paths of the chip. A slow corner PVT may be characterized by slow processing parameters, a lowest acceptable power supply voltage, and a highest allowable temperature. The slowest speed of operation may exist for these conditions. The timing specifications for the chip may indicate that a delay in a path is equal to or less than the delay for the slowest speed for this PVT corner. For other PVT values (e.g., a faster PVT corner), the timing delay for a path may be less than the delay for the slowest speed. The faster speed does not violate timing budgets, but operating the chip at speeds greater than the specification may result in increased power consumption in the chip.

The power consumed by the chip may include dynamic power consumption, which is the power that is expended when charging and discharging the capacitive loads of circuits in the chip. Also, leakage power may be consumed by source-drain leakage and gate leakage of transistors in the chip. Source-drain leakage may include source-drain current that flows in transistors whose gate-source voltages should have otherwise resulted in a completely quiescent transistor.

Adaptive voltage scaling may be used to save both dynamic power and leakage power. For example, different chips (or portions of the chip) may include different PVT combinations and thus different timing for paths. Particular embodiments adjust a power supply voltage of the chip to adjust a path delay to a desired timing budget. For example, increasing the power supply voltage decreases the delay and decreasing the power supply voltage increases the delay. Thus, if the delay is determined to be above the timing budget, the power supply voltage may be increased. The power supply voltage is decreased if the delay is below the critical path timing.

AVS block 104 uses delay line 108 to dynamically adjust a power supply voltage for processing unit 102. Delay line 108 includes multiple components that delay a signal by a certain delay amount. In one example, delay line 108 in DLL 106 may be used. In one embodiment, DLL 106 is part of a double data rate (DDR) interface/controller. The DDR interface/controller is for a synchronous dynamic random access memory (SDRAM). For example, a DDR physical layer (PHY) DLL of the DDR interface/controller can be used. The chip may already include DLL 106 and thus delay 108 for DLL 106 is used to perform adaptive voltage scaling. By using delay lines 108 that are already designed in the chip, adding some circuitry for AVS block 104 is avoided. Additionally, other delay lines 108 may be used, such as a dedicated delay line 108.

Particular embodiments use delay line 108 in DLL 106 to determine whether to increase or decrease the power supply voltage. In one embodiment, the amount of delay determined from DLL 106 is used to determine if a power supply voltage should be increased or decreased. This process will now be described in more detail.

Figure 2A:
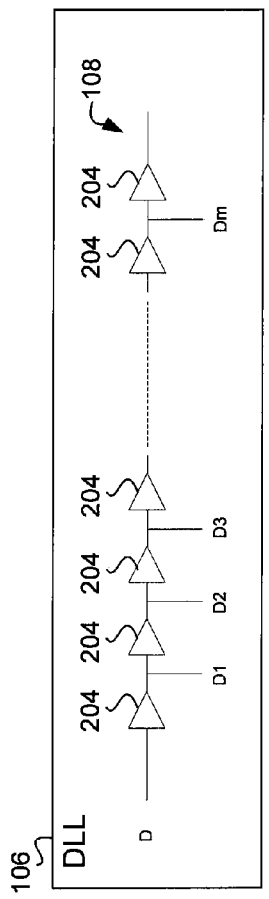
FIG. 2a shows a delay line of a delayed locked loop (DLL) according to one embodiment.

FIG. 2a shows delay line 108 of DLL 106 according to one embodiment. Delay line 108 includes a plurality of delay stages 204. For example, each delay stage may be comprised of a logic element that delays a signal an equal delay amount (a delay line step) for each stage 204.

Figure 2B:
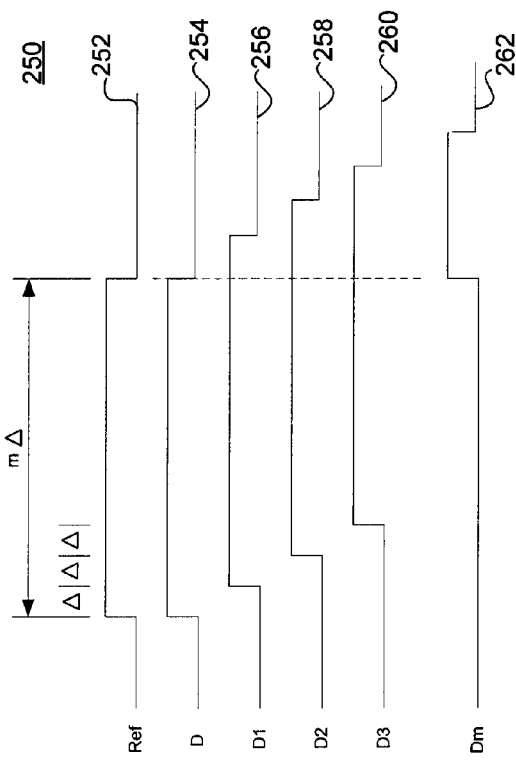
FIG. 2b shows a graph showing the delays for the taps to the delay line according to one embodiment.

A plurality of taps D-Dm to delay line 108 are provided. Each of the taps may represent a different delay from a reference point depending on the tap point in delay line 108. For example, FIG. 2b shows a graph 250 showing the delays for the taps to delay line 108 according to one embodiment.

A reference signal (REF) 252 is provided. The reference signal may be a pulse that is equal to an ideal period for a desired delay. For example, the period may be set by a clock signal from which the pulse for reference signal 252 is derived. Reference signal 252 is input into delay line 108. Each stage 204 may delay reference signal 252 by a delay step ($\Delta$). At 254, a signal D at tap D is shown. At 256, a signal D1 at the tap D1 is shown with a delay step of $\Delta$. At 258, a signal D2 at tap D2 includes two delay steps ($2\Delta$). At 260, a signal D3 at tap D3 includes three delay steps ($3\Delta$). This continues until at 262, a signal Dm shows the delay that is equal to the period of reference signal 252. Each signal D may be a pulse with a different delay.

A variable m is a number of stages 204 in delay line 108 that in total have a delay corresponding to a pulse of reference signal 252. Given a fixed pulse of reference signal 252, the variable m can be determined from delay line 108. The following equation of: Pulse of REF=m*Delta may be used to perform adaptive voltage scaling. The pulse of REF may be equal to the period of an ideal clock signal of the chip. Delta is the amount of delay for each delay line step for a stage 204. The delay line step varies in different PVT corners. For a fixed reference pulse, the variable m changes when Delta changes. That is, when the delay line step is faster, more stages 204 are used in a pulse of reference signal 252. When the delay line step is slower, less stages 204 are used in the pulse of reference signal 252. AVS block 104 tracks the variable m and uses the value to adjust the power supply voltage.

A function may be used by AVS block 104 to determine whether to increase or decrease the voltage. For example, using a current value of the variable m and a current power supply voltage value, AVS block 104 uses the function to determine whether to increase or decrease the voltage. In one embodiment, the function may be implemented in a lookup table that is generated based on testing of the chip.

Figure 3:
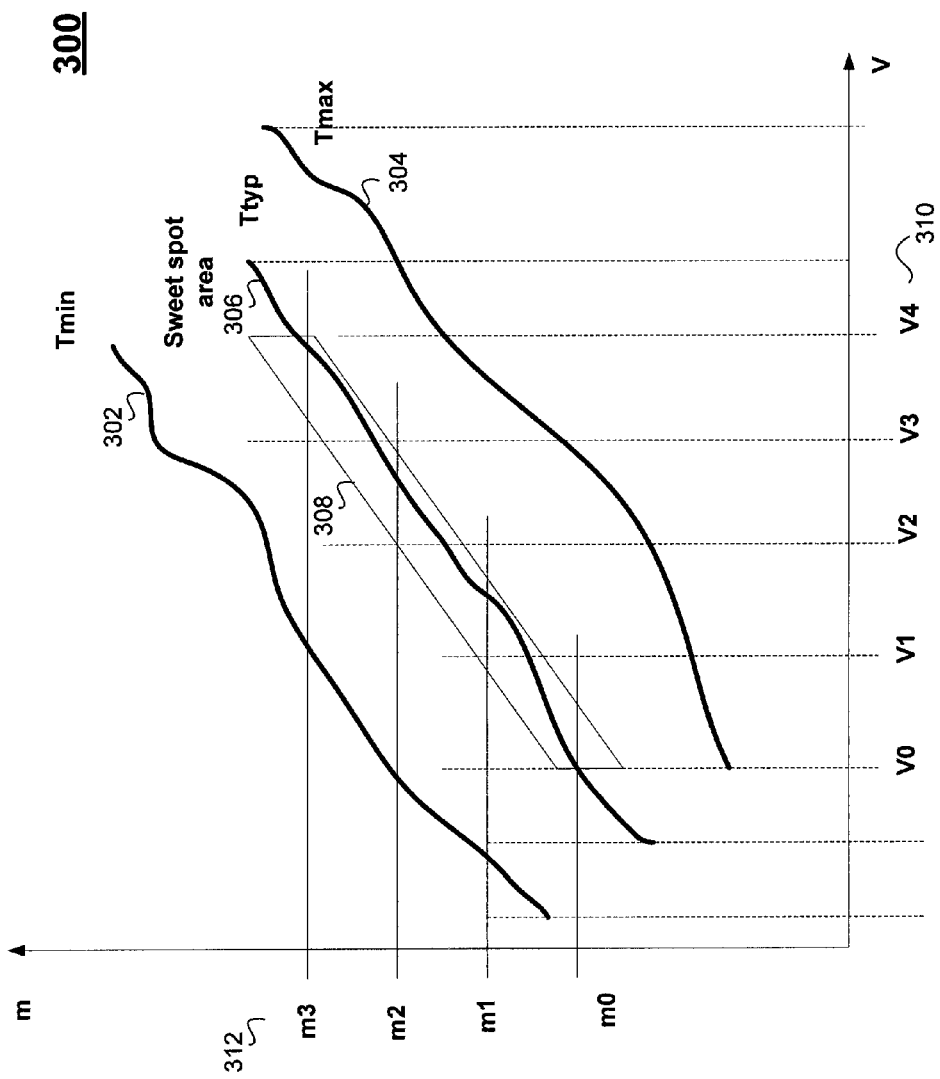
FIG. 3 depicts an example of a chart illustrating a graphical representation of the function according to one embodiment.

A test chip may be used to characterize the function used to perform adaptive voltage scaling. FIG. 3 depicts an example of a chart 300 illustrating a graphical representation of the function according to one embodiment. Graph 300 may be determined based on testing of the test chip. A Tmin millivolt (mV) curve 302 represents different power supply voltages (in mV increments) that are applied to the chip to determine corresponding variable m values at a minimum temperature (Tmin). Interpolation may be used to draw curve Tmin mV curve 302. Tmin mV curve 302 represents the working voltage range for the minimum temperature. The working voltage range is where the chip operates within design specifications when the power supply voltage is applied at the minimum temperature.

A Tmax mV curve 304 represents a working voltage range for a maximum temperature according to design specifications. For example, to determine Tmax mV curve 304, different power supply voltages are applied at the maximum temperature (Tmax) to determine corresponding variable m values. Tmax mV curve 304 is drawn based on the results received and interpolation may also be used. Tmax mV curve 304 represents the working voltage range for the maximum temperature. The working voltage range is where the chip operates within design specifications when the power supply voltage is applied at the maximum temperature.

A typical (Ttyp) mV curve 306 may be determined by applying different power supply voltages at a typical operating temperature, e.g., 25° C., to determine corresponding variable m values. Ttyp mV curve 306 may be drawn based on the variable m values determined and interpolation may be used. Determining Ttyp curve 306 may be optional.

Also, additional mV curves may be determined at different temperatures. The goal of determining different mV curves is to define a sweet spot area 308. Sweet spot area 308 is where it is determined the chip works optimally. As shown, sweet spot area 308 may be an area in between Tmin mV curve 302 and Tmax mV curve 304.

Based on sweet spot area 308, a target power supply voltage range may be split into several sub-ranges shown at 310 as V0-V4. Although 5 sub-ranges are shown, another number of sub-ranges may be used. Each power supply voltage value V0-V4 may correspond to a possible power supply voltage that may be read from the chip. For example, for the power supply voltages 0.9 v to 1.2 v, five 60 mv sub-ranges may be provided. That is, V0 may be at 0.9 v, V1 may be at 0.96 v, V2 may be at 1.02 v, and so on.

At 312, corresponding variable m values are shown. These values are determined based on curves 302, 304, and 306. For each variable m value, the corresponding voltage value may be determined that is within (or closest to) sweet spot area 308. For example, for the voltage value of V1, it is desired that the variable m value be m1. These values are the ideal values.

Once curves 302, 304, and 306 are determined, correlation between variable m values for DLL 106 and the delay of critical timing paths in the chip may be determined. For example, the critical path target timing may be used as a pulse of reference signal REF 252. However, if reference signal REF 252 and processing unit 102 are operating at different frequencies, scaling may be necessary. For example, the pulse of signal REF may be different from the critical path timing target.

Figure 4:
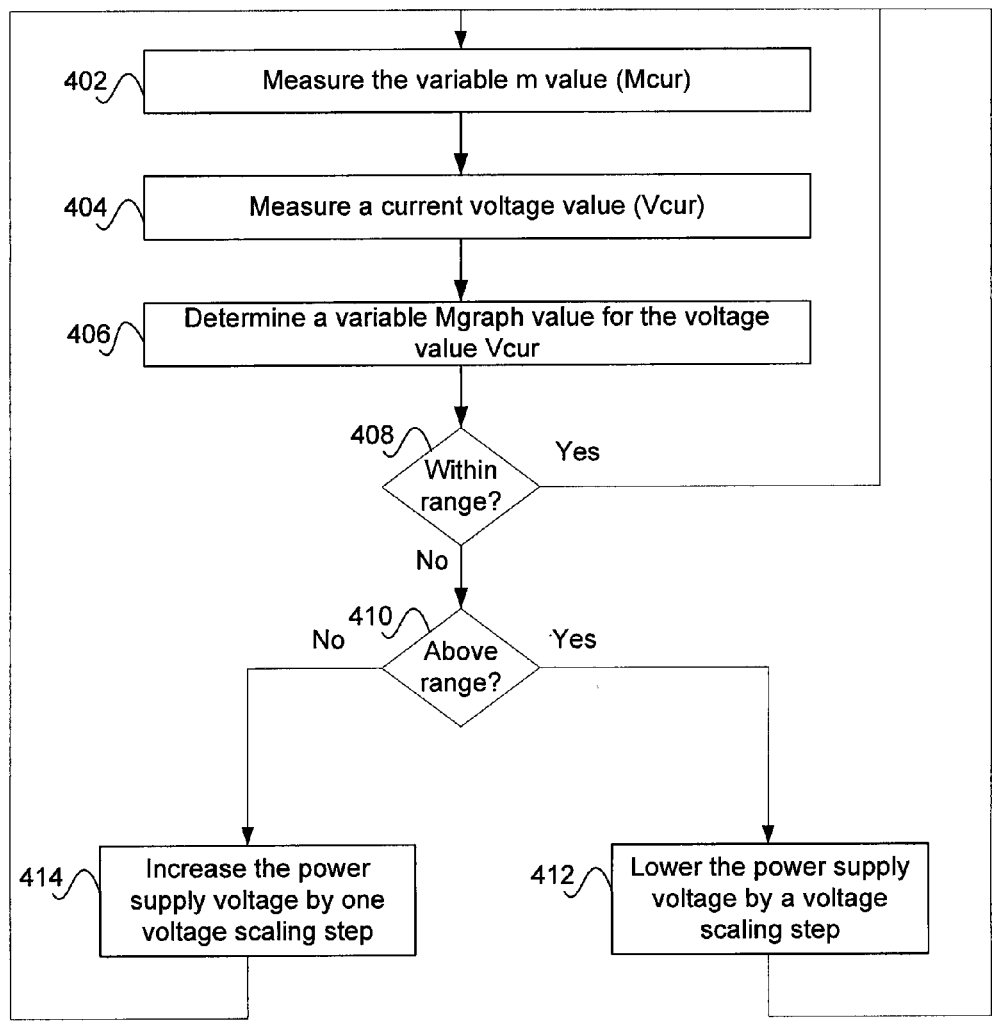
FIG. 4 depicts a simplified flowchart of a method for performing adaptive voltage scaling according to one embodiment.

Graph 300 may then be used to perform adaptive voltage scaling for a chip. Different chips (or portions of a chip) may have different PVT combinations that result in different path delays. Adaptive voltage scaling is then used to compensate for the different delays. FIG. 4 depicts a simplified flowchart 400 of a method for performing adaptive voltage scaling according to one embodiment. At 402, AVS block 104 measures the variable m value (Mcur). For example, the variable m value is determined using delay line 108 where the number of delay stages during a pulse of signal REF is counted. For example, referring to FIG. 2b, the values for taps D-Dm are read. When a value for one of the taps changes state, then the value of m is determined. For example, as the signal REF is propagated through delay line 108, the signal from a tap is high (e.g., at a high logic level) when the signal REF is also high. The signal from each tap will be high until REF goes low (e.g., a low logic level). When the signal REF goes low, the number of delay stages in which the high value is output is counted. This yields the value of the variable m. As discussed above, the number of delay stages for the signal REF varies based on different PVT corners.

At 404, AVS block 104 measures a current voltage value (Vcur). For example, the power supply voltage may be measured.

At 406, an Mgraph value for the voltage value Vcur is determined from graph 300. The Mgraph value is the corresponding variable m value for the Vcur value using graph 300 as described in FIG. 3. For example, a table may be used to determine the Mgraph value. The table may have been generated based on graph 300 shown in FIG. 3. For example, the table represents corresponding values of variable m for power supply voltages that were determined based on sweet spot area 308. In one example, if the voltage V1 is measured, then the Mgraph value is m1.

At 408, it is determined whether the Mcur value is within a working range corresponding to the Mgraph value that was looked up at 406. For example, it is determined if the Mcur value is within a range of the values Mgraph+X to Mgraph−X, where the value X is a programmable value. For example, the value X may be a number that creates a range of Mgraph values. Referring to FIG. 3, the range may be m0 to m2 for a voltage V1. The range may be based on sweet spot area 308.

If the Mcur value is within the range, then the power supply voltage is not adjusted because it is assumed the delay is within a desirable range for critical path timing. The process then reiterates to step 402 to perform the measurements again.

However, if the Mcur value is not within the range, then at 410, it is determined if the Mcur value is greater than the Mgraph value+X. At 412, if the Mcur value is greater than Mgraph+X, then the power supply voltage is lowered by one or more voltage scaling steps. For example, if the power supply voltage is at 1 volt, then the power supply voltage may be lowered by a voltage scaling step, which may be 20 millivolts, to 0.98 volts. The voltage scaling step may be a programmed value. The power supply voltage may be adjusted in small increments as the process continually adjusts the power supply voltage until critical path timing is within the timing budget. The power supply voltage may be lowered because the delay that has been measured is less than the critical path's timing budget. This is because the more stages are being used during a pulse of the reference signal indicates that the delay step is faster than desired. For example, a delay may be 0.8 ns but the critical path target timing budget may be 1 ns. Thus, by lowering the power supply voltage, the delay for each delay stage 204 is increased. This causes the Mcur value to decrease, which brings the Mcur value closer to the desired range and also brings the critical path delay closer to the critical path timing budget. In addition to moving the measured delay closer to the critical path target timing budget, lowering the power supply voltage saves power.

At 414, if the Mcur value is not greater than Mgraph+X, but is rather less than Mgraph−X, then, the power supply voltage is increased by one or more voltage scaling steps. In this case, the Mcur value indicates that the delay measured is greater than the critical path timing budget. To decrease the delay, the power supply voltage is increased. The increase in power supply voltage causes a decrease in the delay line step of each delay stage 204, which increases the Mcur value. This brings the Mcur value closer to the desired range by increasing the number of delay stages 204 in the pulse of the reference signal.

After lowering or increasing the power supply voltage at 412 or 414, respectively, the process reiterates to 402 to perform the measurement process again. The process continues as different values are measured for Mcur and the power supply voltage, and at each measurement, one or more voltage scaling steps may be either added or subtracted from the power supply voltage. Eventually, the power supply voltage is determined such that the delay measured is substantially equal to the critical path target timing budget.

Figure 5:
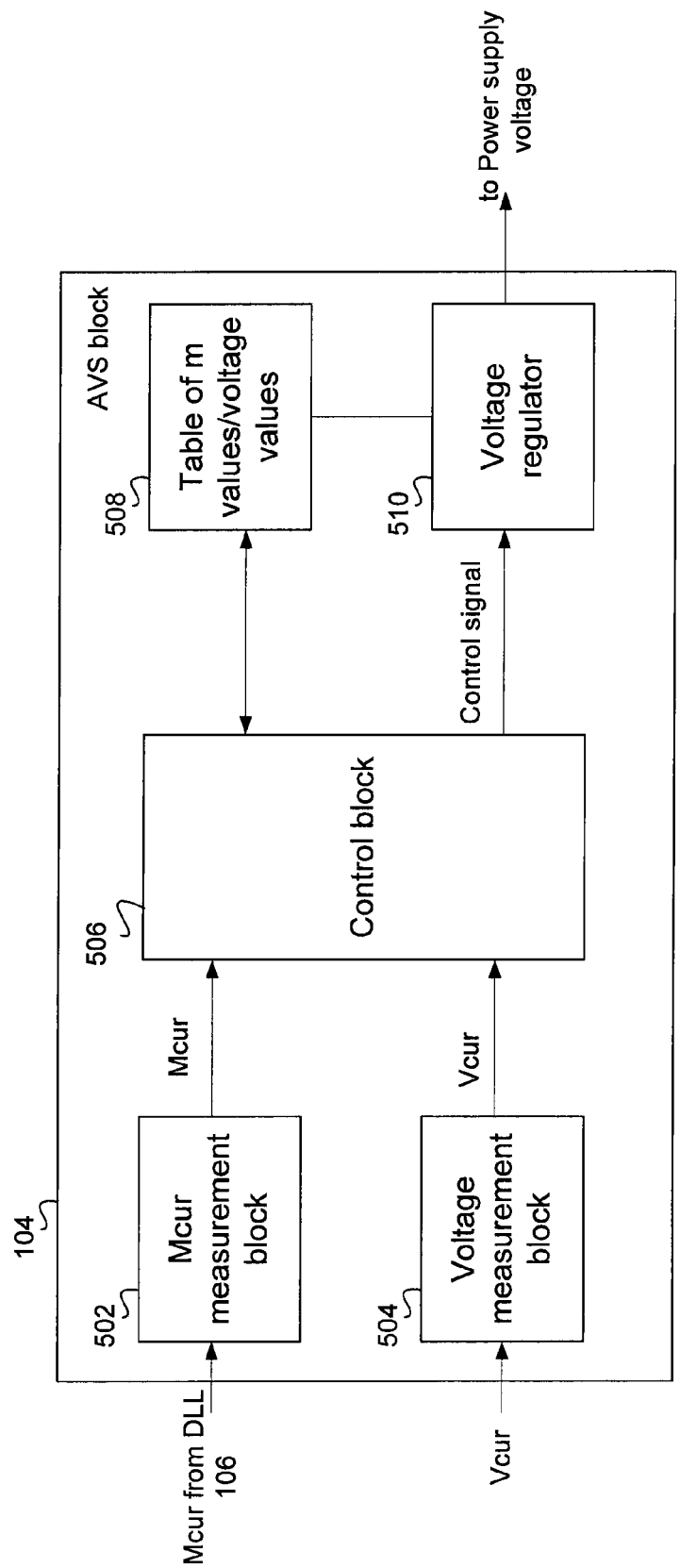
FIG. 5 depicts a more detailed example of an AVS block according to one embodiment.

FIG. 5 depicts a more detailed example of AVS block 104 according to one embodiment. An Mcur measurement block 502 measures the Mcur value from DLL 106. Also, a voltage measurement block 504 measures the current power supply voltage value Vcur.

These values are received at a control block 506. Control block 506 determines a control signal that indicates whether or not a power supply voltage should be increased or decreased. Control block 506 uses a look-up table 508 representative of a graph such as in FIG. 3 to determine the control signal. Although look-up table 508 is described, other methods may be used. In one embodiment, the voltage value Vcur is used to determine a corresponding Mgraph value from table 508.

Control block 506 then compares the Mgraph value to the Mcur value to determine whether or not the power supply voltage should be increased, decreased, or kept the same. Control block 506 makes this determination as described with respect to FIG. 4.

A control signal is output to a voltage regulator 510. Voltage regulator 510 then adjusts a power supply voltage for the chip by one or more voltage scaling steps. For example, the power supply voltage may be increased or decreased by one voltage scaling step.

Accordingly, particular embodiments use delay line 108 to perform adaptive voltage scaling. A temperature monitor or frequency monitor may not needed. The adaptive voltage scaling method is low cost and may be implemented easily because delay lines may already exist on the chip. Adaptive voltage scaling also saves power (both dynamic and static) by lowering the power supply voltage when the chip timing is too fast. Also, lowering the power supply voltage decreases the source-drain leakage and gate leakage, which decreases the leakage power used.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. A method comprising:
    passing an electrical pulse through a series of delay stages of a delay line;
    counting a number-of-stages corresponding to how many of the delay stages are simultaneously inputting the pulse;
    measuring a supply voltage that is powering the delay stages;
    converting the measured supply voltage, using a predetermined correlation of number-of-stages versus voltage, to a derived number-of-stages;
    comparing the measured number-of-stages to the derived number-of-stages; and
    adjusting the supply voltage by
        decreasing the voltage by a voltage increment if the measured number-of-stages exceeds the derived number-of-stages, and
        increasing the voltage by a voltage increment if the measured number-of-stages is less than the derived number-of-stages.

2. The method of claim 1, further comprising:
    predetermining the length of the pulse as a function of both (i) a critical path timing target of a processing unit to be powered by the supply voltage and (ii) a difference between an operating frequency of the delay line and an operating frequency of the processing unit.

3. The method of claim 1, further comprising:
    not adjusting the supply voltage if the measured number-of-stages is within a predetermined threshold value from the derived number-of-stages.

4. The method of claim 3, wherein the correlation is a typical-temperature correlation that is for a typical operating temperature, and wherein the method further comprises:
    empirically generating a correlation of number-of-stages versus voltage at a maximum operating temperature;
    empirically generating a correlation of number-of-stages versus voltage at a minimum operating temperature; and
    predetermining the threshold value based on both the maximum-temperature correlation and the minimum-temperature correlation.

5. The method of claim 1, wherein at least one of the delay stages applies a delay that is different than a delay applied by another of the delay stages.

6. The method of claim 1, wherein the passing, the counting, the measuring, the converting, the comparing and the adjusting are repeated continuously.

7. The method of claim 1, wherein the delay line is part of an integrated circuit chip and serves a function, for the chip, other than for use in adjusting supply voltage.

8. The method of claim 1, wherein the correlation is provided by a lookup table of number-of-stages versus voltage.

9. The method of claim 1, wherein the correlation is provided by a graph of number-of-stages versus voltage.

10. The method of claim 1, further comprising:
    predetermining the correlation empirically using a test chip.

11. An apparatus comprising:
    a delay line that includes a series of delay stages; and
    a measurement block configured to
        pass an electrical pulse through the delay line,
        count a current number-of-stages corresponding to how many of the delay stages are simultaneously inputting the pulse,
        measure a supply voltage that is powering the delay stages,
        convert the measured supply voltage, using a predetermined correlation of number-of-stages versus voltage, to a derived number-of-stages,
        compare the measured number-of-stages to the derived number-of-stages, and
        adjust the supply voltage by (i) decreasing the voltage by a voltage increment if the measured number-of-stages exceeds the derived number-of-stages and (ii) increasing the voltage by a voltage increment if the measured number-of-stages is less than the derived number-of-stages.

12. The apparatus of claim 11, wherein the pulse has a length that is predetermined as a function of both (i) a critical path timing target of a processing unit to be powered by the supply voltage and (ii) a difference between an operating frequency of the delay line and an operating frequency of the processing unit.

13. The apparatus of claim 11, wherein the measurement block is configured not to adjust the supply voltage if the measured number-of-stages is within a predetermined threshold value from the derived number-of-stages.

14. The apparatus of claim 13, wherein the predetermined threshold value is predetermined from both (i) an empirically generated correlation of number-of-stages versus voltage at a maximum operating temperature and (ii) an empirically generated correlation of number-of-stages versus voltage at a minimum operating temperature.

15. The apparatus of claim 11, wherein at least one of the delay stages applies a delay that is different than a delay applied by another of the delay stages.

16. The apparatus of claim 11, wherein the measurement block is configured to continuously repeat the passing, the counting, the measuring, the converting, the comparing and the adjusting.

17. The apparatus of claim 11, wherein the delay line is part of an integrated circuit chip and serves a function, for the chip, other than for use in adjusting supply voltage.

18. The apparatus of claim 11, wherein the correlation is provided by a lookup table of number-of-stages versus voltage.

19. The apparatus of claim 11, wherein the correlation is provided by a graph of number-of-stages versus voltage.

20. The apparatus of claim 11, wherein the correlation is predetermined empirically using a test chip.

* * * * *